United States Patent
Katayama et al.

(10) Patent No.: US 6,388,920 B2
(45) Date of Patent: *May 14, 2002

(54) SEMICONDUCTOR MEMORY DEVICE HAVING FAULTY CELLS

(75) Inventors: Kunihiro Katayama, Chigasaki; Takayuki Tamura; Satoshi Watatani, both of Yokohama; Kiyoshi Inoue, Tokyo; Shigemasa Shiota, Tachikawa; Masashi Naito, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,133

(22) Filed: Jun. 22, 2001

Related U.S. Application Data

(63) Continuation of application No. 09/824,778, filed on Apr. 4, 2001, which is a continuation of application No. 09/477,665, filed on Jan. 5, 2000, now Pat. No. 6,236,601, which is a continuation of application No. 09/125,547, filed as application No. PCT/JP96/03501 on Nov. 29, 1996, now Pat. No. 6,031,758.

(30) Foreign Application Priority Data

Feb. 29, 1996 (JP) ............................................. 8-042451

(51) Int. Cl.[7] .............................. G11C 16/06; G11C 7/00
(52) U.S. Cl. .............................. 365/185.09; 365/185.11; 365/200
(58) Field of Search ........................... 365/200, 185.09, 365/185.11

(56) References Cited

U.S. PATENT DOCUMENTS

| | | | |
|---|---|---|---|
| 5,123,016 A | 6/1992 | Muller et al. | 365/200 |
| 5,640,506 A | 6/1997 | Duffy | 395/182 |
| 5,732,208 A | 3/1998 | Tamura et al. | 714/28 |
| 5,844,910 A | 12/1998 | Niijima et al. | 371/10.2 |
| 5,859,804 A * | 1/1999 | Hedberg et al. | 365/200 |
| 5,920,515 A * | 7/1999 | Shaik et al. | 365/200 |
| 6,119,245 A | 9/2000 | Hiratsuka | 714/7 |

FOREIGN PATENT DOCUMENTS

| | | |
|---|---|---|
| JP | 62 239252 | 10/1987 |
| JP | 61 219045 | 9/1988 |
| JP | 63/219045 | 9/1988 |
| JP | 3-131951 | 6/1991 |
| JP | 03/131951 | 6/1991 |
| JP | 4-308971 | 10/1992 |
| JP | 4-311236 | 11/1992 |
| JP | 5-67005 | 3/1993 |
| JP | 05/067005 | 3/1993 |
| JP | 05/274219 | 10/1993 |
| JP | 5-274219 | 10/1993 |
| JP | 6-20483 | 1/1994 |
| JP | 06/020483 | 1/1994 |
| JP | 6-124596 | 5/1994 |
| JP | 6-105443 | 12/1994 |
| JP | 7-56816 | 3/1995 |
| JP | 07/056816 | 3/1995 |

* cited by examiner

Primary Examiner—Trong Phan
(74) Attorney, Agent, or Firm—Antonelli, Terry, Stout & Kraus, LLP

(57) ABSTRACT

In response to a read command received by a system interface unit for accessing a plurality of blocks of data stored in said non-volatile semiconductor memory, a controller carries out selective read operations of blocks of data to two memories from the non-volatile semiconductor memory. The controller also carries out parallel operations of data transferring a first block of data, which has already been subjected to error detection and error correction operations by an error correction unit, from one of the two memories to a host system via said system interface unit and of data transferring a second block of data to be subjected to the error detection and error correction operation, from said non-volatile semiconductor memory to the other of the two memories.

9 Claims, 10 Drawing Sheets

BLOCK ADDRESS MAP

FIG.3
(a)
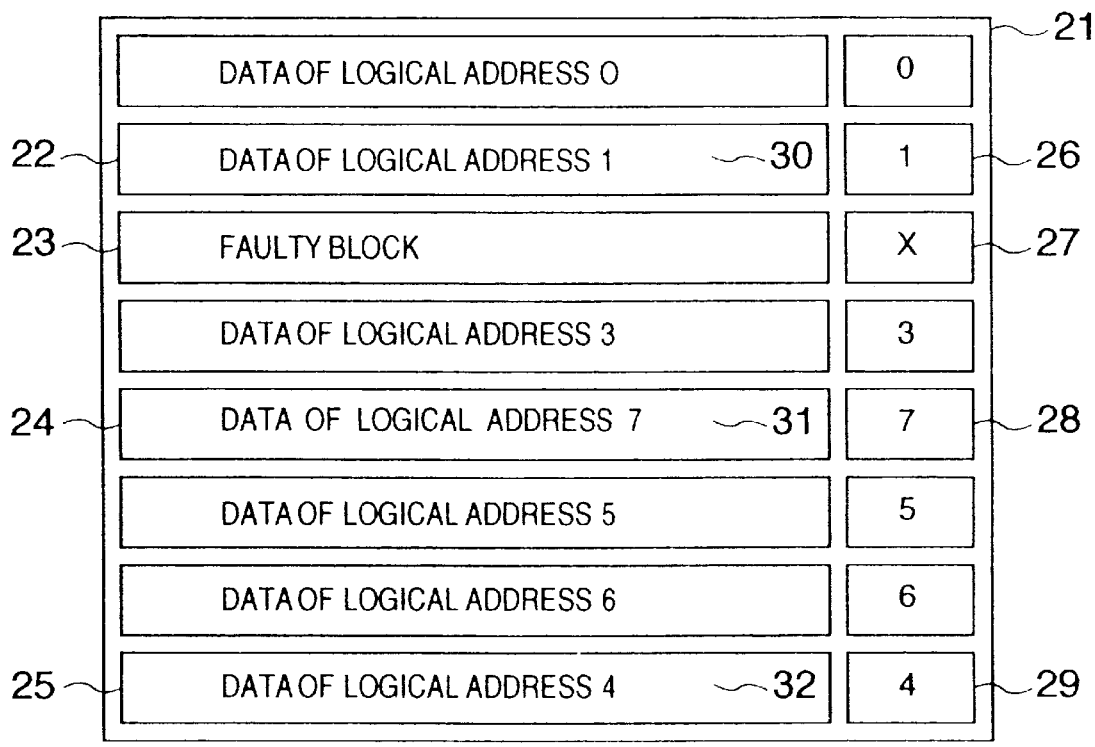
(b)
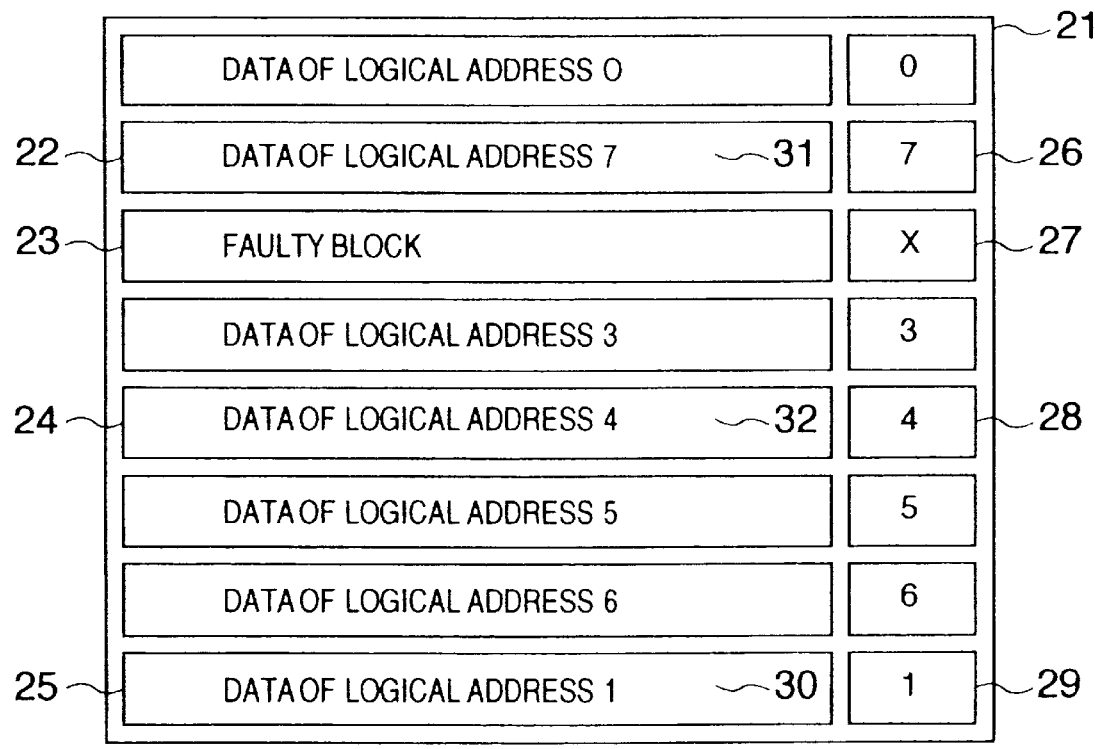

SEMICONDUCTOR MEMORY DEVICE HAVING FAULTY CELLS

CROSS-REFERENCE TO RELATED APPLICATION

This application is a continuation of application Ser. No. 09/824,778, filed on Apr. 4, 2001; which is a continuation of application Ser. No. 09/477,665, filed on Jan. 5, 2000 (now U.S. Pat. No. 6,236,601); which is a continuation of application Ser. No. 09/125,547, filed on Dec. 23, 1998 (now U.S. Pat. No. 6,031,758), which is an application filed under 35 USC §371 of International application PCT/JP96/03501, filed Nov. 29, 1996, and the entire disclosures of which are herein incorporated by reference.

TECHNICAL FIELD

The present invention relates in general to a semiconductor memory device in which an electrically reloadable nonvolatile semiconductor memory is used as a storage medium, and more particularly to a semiconductor memory device employing a semiconductor memory which includes partially faulty cells and which becomes faulty if the reloadable operation is carried out at frequent intervals.

BACKGROUND ART

An electrically reloadable nonvolatile memory has more advantageous features as a memory device of an information apparatus in terms of the low power consumption, the resistance against the vibrational shock, the high speed operation and the like as compared with other devices such as a magnetic memory device and an optical disc device. On the other hand, however, since the manufacturing process thereof is complicated and in addition thereto, the operations which are in principle irreversible against semiconductor are repeatedly carried out, there arises a problem that occurrence of faulty portions and degradation in use thereof are remarkable. As a result, the manufacturing yield thereof is poor, the cost required therefor is expensive and reliability in operation thereof becomes a problem.

In order to solve the above-mentioned problems, the technique has been developed such that the faulty portions of the memory are previously registrated so as not to be used, and the number of times of use of the data blocks is recorded and then if this number of times is increased, then the region of interest is replaced with another region to suppress the increase in the number of times of use thereof, thereby increasing the life of the semiconductor memory device. This technique is disclosed in JP-A-6-124596 for example.

According to this disclosed technique, there is provided a memory for storing therein an address conversion table showing the comparison between the logical addresses and the physical addresses, i.e., the correspondence between the logical address specified by a host and the corresponding physical address on the memory. As a result, the physical address of the faulty region is registered in the address conversion table so as to show that it is faulty so that the logical address specified by the host is not assigned thereto, thereby preventing the faulty portion from being used.

In addition, the number of times of erasing is administrated. That is, if the number of times of erasing has reached a fixed value, then the data of the region of interest is replaced with the data of another region and at the same time, the address values on the address conversion table are reloaded to register again the data relating to the correspondence between the logical addresses and the physical addresses so that the proper correspondence therebetween can be obtained. All of the logical address values in use are registered in the above-mentioned address conversion table. Then, the high speed volatile memory such as a DRAM or an SRAM is used as the storage-medium for the address conversion table.

The reason of employing the high speed volatile memory is that the address conversion can be carried out at a high speed; when the replacement of the address of interest with another address occurs, the registration can be partially reloaded at a high speed; the mass storage of the data can be realized by utilizing the relatively inexpensive memory; and so forth.

In the above-mentioned prior art, since the registration of the address conversion is carried out with respect to all of the logical addresses, when the memory device becomes of mass storage, the scale of the address conversion table becomes large and hence the mass storage memory for registration is required. In addition, since the memory device is of a volatile type, if the power source is disconnected, then all of the data stored therein will be erased. As a result, when turning on the power source again, all of the registered values need to be written thereto from another nonvolatile memory and hence the time period required for the activation of the memory device is increased. This is a problem.

In addition, since the external memory for registration becomes of mass storage, there arises a problem that the number of components is increased, which disturbs the miniaturization and the promotion of lowering the cost of the memory device.

In addition, if the nonvolatile memory is employed as the above-mentioned memory for registration, then there arises a problem that since the access time of the nonvolatile memory is generally long, the access time of the memory device itself becomes necessarily long.

In addition, if the back-up power source is provided for the volatile memory for registration, then the number of components is further increased, which disturbs the miniaturization and the promotion of lowering the cost of the memory device. This is a problem.

In the light of the foregoing, it is therefore an object of the present invention to provide a mass storage semiconductor memory device, in which the miniaturization thereof and the promotion of lowering the cost thereof can be made, and also the activation time and the access time are reduced, by solving the above-mentioned problems associated with the prior art.

It is a concrete object of the present invention to provide, by either reducing the capacity of the external memory for registration or removing the external memory for registration, a mass storage semiconductor memory device in which the activation time and the access time are both short.

It is a concrete object of the present invention to provide, for use in a mass storage semiconductor memory device in which either the capacity of the external memory for registration is reduced or the external memory for registration is removed, an access method by which both of the activation time and the access time can be made short.

It is another object of the present invention to provide, for use in a mass storage semiconductor memory device in which either the capacity of the external memory for registration is reduced or the external memory for registration is removed, a controller which is capable of realizing the short activation time and access time.

DISCLOSURE OF INVENTION

According to the present invention, there is provided a semiconductor memory device in which a semiconductor memory having partially faulty memory cells each of which is defective in the function for storing data is used as a storage medium, and the holding of the data or the reading of the data thus held is carried out in blocks containing a plurality of data, the semiconductor memory device including: faulty location registering means for registering address values of faulty regions containing therein the memory cells each of which is defective in the storage function in either ascending order or descending order depending on the magnitudes of the address values in blocks; alternative storage regions as storage regions with the address values of which the address values of the faulty regions are replaced in blocks; alternative location registering means for registering the replaced address values which are obtained by replacing the address values of the faulty regions stored in the faulty location registering means with the address values of the alternative regions; fault registration retrieval means for retrieving the faulty location registering means in order to judge whether or not the address value in the region in or from which the data is held or read out corresponds to the address value on the faulty region; access control means for carrying out the control so as, when the address value in the region in or from which the data is held or read out is registered in the faulty location registering means, to access the alternative region by referring to the alternative location registering means; and registration update means for carrying out, when a fault newly occurs, the reloading in accordance with the rule of either the ascending order or descending order in the faulty location registering means, the decision of the alternative location therefor and the update of the alternative location registering means.

In addition, the fault registration retrieval means of the faulty location registering means of the semiconductor device firstly devices the regions of the faulty location registering means into halves to estimate in which side the faulty location is present, and then divides the side of the halves in which the faulty location is estimated to be present into halves to estimate in which side the faulty location is present. By continuing this process, it is finally judged by the fault registration retrieval means whether or not the data relating to the faulty location is registered in the faulty location registering means to carry out the retrieval thereof, thereby realizing the high speed retrieval.

In addition, according to the present invention, there is provided a semiconductor memory device in which a semiconductor memory having partially faulty memory cells each of which is defective in the function of storing data is used as a storage medium, and when holding the data or reading out the data thus held, a fixed amount of data which is continuously transferred is administrated as the data administrative unit, and administrative information storage regions in which administrative information is stored every data administrative unit are provided in the inside of the semiconductor memory, and which includes use frequency administrating means for monitoring the use frequency of the data administrative unit, the semiconductor memory device including administrative information storage regions used to administrate a plurality of memory cells as an administrative storage unit and use frequency administrating means for monitoring the use frequency of blocks, wherein administrative addresses as the logical addresses which are determined for the sake of convenience for administration are registered in the administrative information storage regions of all of the blocks, and the administrative address of interest is made an address matching the physical address which is basically the physical address value of the semiconductor memory so that in the access to the data which is stored in the block specified by the administrative address of interest, the physical address equal to the administrative address of interest is accessed to carry out the desired access, while when it is judged by the use frequency administrating means that the data stored in the block should be exchanged for the data stored in another block which is different in the use frequency therefrom, the data stored in the block of interest is exchanged for the data stored in another block, and during this exchange, the administrative address of the stored data is registered in the administrative information storage region, and in the access to the data stored in subsequent block specified by the administrative address of interest, by referring to the administrative address which is registered in the administrative information storage region of the physical address equal to the administrative address of interest, the physical address equal to the administrative address value thus registered is accessed to obtain the desired data stored in the associated block.

Then, when it is judged by the use frequency administrating means that the data of the block in which the above-mentioned administrative address does not match the above-mentioned physical address due to the fact that the replacement of the data is already carried out needs to be further replaced with the data of another block, after the compatibility of the stored data with the administrative storage unit which became an object when the replacement was carried out at the last time has been released by carrying out the replacement again, the data stored in the region of interest is replaced with the data stored in another region.

In addition, as another means, alternative address registration regions for the overall storage regions of the data, and alternation regions are provided in the inside of the semiconductor memory. The alternative address registration regions are arranged in the registration order in accordance with the physical order for the storage of the data on the memory so that in the retrieval of the alternative addresses, the registered location becomes uniquely clear on the basis of the physical position of the region to which the alternative was made.

Then, an administrative information region is provided every data administrative unit. At least the address information of the stored data, the specific code exhibiting that the region of interest is not faulty, and the error correction code for such administrative information are stored in the administrative information region. When the access request is issued from the outside, the error detection and correction of the corresponding region based on the error correction code, and the comparison with respect to the specific code exhibiting that the region of interest is not faulty are carried out. Then, when both are normal, the region of interest is judged to be the usable region to execute the access processing, while when one of them is not normal, the region of interest is processed as the disusable region.

In addition, the storage regions in which the data of the data administrative units is temporarily stored are provided for two units. Then, the transfer of the data to/from the outside and the transfer of the data to/from the above-mentioned semiconductor memory are carried out alternately, thereby making both the transfer possible at the same time. In addition thereto, the control for carrying out the access with the faulty memory cell avoided is processed in parallel to the transfer of the data to/from the outside.

Since any of the address values of the regions which are not faulty is not registered and only the address value of the region which is faulty is registered, the amount of registered data can be reduced and hence the capacity of the memory for registration can be reduced. In addition, since the faulty addresses are registered in either ascending order or descending order, when retrieving a certain address value, if an arbitrary location within the registration memory is referred, it can be decided rashly whether the certain address value is registered on the side of the address values each smaller than the referred address value or on the side of the address values each larger than the referred address value. From a large amount of registered values as well, it can be judged at a relatively high speed whether or not the certain address value is registered or in which location the certain address value is registered.

In addition, in the case where the region in which the administrative information is stored is provided in each of the blocks of the memory of the storage medium, the logical address value can be registered in that region, and also when the physical location of interest needs to be replaced with another physical location due to the frequent reloading and the like thereof, the logical address value within the administrative information is replaced, thereby being able to cope simply with such a situation. In addition thereto, since those logical address values do not need to be registered in the form of a table in the external memory, there is no need of providing any other volatile memory, and also there is no need of reconstructing the table when turning on the power source.

Then, when in the registration of those logical address values, for the block for which the replacement was carried out one time, the additional replacement is required, the last replacement is returned to the original state and then the required replacement is carried out, whereby the number of times of reference, to the administrative information region, for grasping the logical address values has only to be one at the most and hence the situation in which the reference is forced to be made rotationally can be avoided.

In addition, according to the measure that if the fault registration region for all of the addresses is provided as another means, even if the access should be made to the faulty location, since from that physical location, the location where the alternative address is registered can be uniquely determined, it is possible to shorten greatly the retrieval time. In addition, since the judgement for the fault is carried out on the basis of the two codes, i.e., the error correction code and the specific code exhibiting the region which is not faulty, it is possible to reduce remarkably the probability that the judgement with respect to the fault/nonfault is made by mistake.

In addition, the storage regions in which the transfer data is temporarily stored are provided for two units, and in this connection, one is used in the transfer of the data to/from the outside, while the other is used in the transfer of the data to/from the memory, and those transfers are switched alternately over to each other, which results in both of the transfers being able to be carried out at the same time. In addition thereto, in the case where the speed of the transfer of the data to/from the memory is higher than the speed of the transfer of the data to/from the outside, since the overhead time required for the judgement whether or not the accessed region is faulty and the retrieval of the alternative address can lapse in the background of the transfer of the data to/from the outside, the apparent transfer performance can be improved.

In addition, according to the present invention, there is provided a semiconductor memory device in which a semiconductor memory having partially faulty cells is used for a part of or all of a storage medium, and when writing, holding or reading out the data to, in or from the storage medium, a fixed amount of data is treated as a data administrative unit, the semiconductor memory including, in the inside thereof, storage regions in which the data of the data administrative unit is stored, alternative regions of the storage regions and address registration regions of the alternative regions, wherein address values showing the respective alternative regions are stored in addresses, within the regions in which the alternative addresses are registered, in accordance with the address values in the storage regions.

In addition, the present invention may provide the semiconductor memory device wherein the storage regions include administrative information, respectively, and store therein, as the administration information, fault judgement information based on which it is judged whether or not each of the storage regions is faulty, and when the access request is made to the storage region of interest, it is judged whether or not the storage region of interest thus accessed thereto is the usable region using the fault judgement information of the storage region of interest, and if it is judged that the storage region of interest is the usable region, then the access processing is executed, while if it is judged that the storage region of interest is not the usable region, then the alternative address registration region is accessed to obtain the desired address, and then the alternative region is accessed.

In addition, according to the present invention, there is provided a semiconductor memory device in which a semiconductor memory having partially faulty cells is used for a part of or all of a storage medium, and when writing, holding or reading out the data to, in or from the storage medium, a fixed amount of data is treated as a data administrative unit, the semiconductor memory including, in the inside thereof, storage regions in which the data of the data administrative unit is stored, alternative regions of the storage regions and address registration regions of the alternative regions, wherein the storage regions include administrative information, respectively, and store therein, as the administrative information, fault judgement information consisting of correction information based on which the detection and correction of an error of the data stored in the storage regions are carried out and detection information based on which it is detected whether or not each of the storage regions is faulty, and when the access request is made to the storage region of interest, it is judged using the fault judgement information corresponding to the storage region of interest whether or not the storage region of interest thus accessed thereto is the usable region, and if it is judged that the storage region of interest is the usable region, then the access processing is executed.

In addition, the present invention may provide the semiconductor memory device wherein the data which is different from the alternative address value is registered in the registration location of the region which is not faulty in the alternative address registration regions, so that it can be judged whether or not the faulty region is registered.

In addition, the present invention may provide that with respect to the different data, the bits thereof are either all 1s or all 0s.

In addition, the present invention may provide the semiconductor memory device wherein when the access request is made to the storage region of interest, the detection and correction of an error are carried out using the correction information, and when the discorrectable error is detected, the storage region of interest is judged to be the disusable region, while there is no error or when the correctable error is corrected, it is detected using the detection information whether or not the region of interest is faulty, and if it is judged that the region of interest is not faulty, then the region of interest is judged to be the usable region to execute the access processing, while if it is judged that the region of interest is faulty, then the region of interest is processed as the disusable region.

In addition, according to the present invention, there is provided a semiconductor memory device in which a semiconductor memory having partially faulty cells is used for a part of or all of a storage medium, and when writing, holding or reading out the data to, in or from the storage medium, a fixed amount of data is treated as a data administrative unit, the semiconductor memory device including means for producing and adding fault judgement information based on which for the transfer data resulting from the request of storing data, it is judged whether or not a storage region in which the transfer data has been stored becomes faulty after completion of the storage, wherein when issuing the request of reading out the data thus stored, the fault judgement processing is executed using the fault judgement information, and the storage region which has been judged to be faulty is treated as the faulty region, and also the data which is stored in the faulty region is transferred to the alternative region after having been corrected.

In addition, the present invention may provide that the storage regions in which the stored data of the data administrative unit is temporarily stored are provided for two units and outside the storage medium, and the access processing using the fault judgement information is executed in parallel with the transfer of the data to/from the outside.

In addition, according to the present invention, there is provided a method of accessing to a semiconductor memory device in which a semiconductor memory having partially faulty cells is used for a part of or all of a storage medium, wherein the storage region which is provided in the inside of the semiconductor memory and in which the data is stored is accessed to judge whether or not it is faulty, and if it is judged that the storage region of interest is not faulty, then this access is continued, while if it is judged that the storage region of interest is faulty, then an address registration region of an alternative region is accessed to obtain the address of the alternative region, and the alternative region is accessed on the basis of the address thus obtained.

In addition, according to the present invention, there is provided a semiconductor memory device in which a semiconductor memory having partially faulty cells is used for a part of or all of a storage medium, the semiconductor memory device including, in the inside thereof, storage regions in which the data of the data administrative unit is stored, alternative regions of the storage regions, and address registration regions of the alternative regions, wherein when accessing to the data stored in the semiconductor memory, a time period required for accessing to the semiconductor memory in the case where the alternative region is not yet substituted for the data storage region is shorter than a time period required for accessing to the semiconductor memory in the case where the alternative region is already substituted for the data storage region.

In addition, according to the present invention, there is provided a semiconductor memory device in which a semiconductor memory having partially faulty cells is used for a part of or all of a storage medium, the semiconductor memory device including, in the inside thereof, storage regions in which the data of the data administrative unit is stored, alternative regions of the storage regions, and address registration regions of the alternative regions, wherein when accessing to the data stored in the semiconductor memory, the number of times of access to the semiconductor memory in the case where the alternative region is not yet substituted for the data storage region is smaller than the number of times of access to the semiconductor memory in the case where the alternative region is already substituted for the data storage region.

In addition, according to the present invention, there is provided a semiconductor memory controller for controlling writing and reading of data to and from a semiconductor memory storage medium having partially faulty cells and including storage regions in which the data of data administrative unit is registered, alternative regions of the storage regions, and address registration regions of the alternative regions, wherein when there is issued a request of accessing to the storage region of interest, using fault judgement information of the storage region of interest exhibiting whether or not the data stored in the storage region of interest is faulty, it is judged whether or not the storage region of interest is a usable region, and if it is judged that the storage region of interest is a usable region, then the access processing is executed.

In addition, the present invention may provide that when there is issued the request of accessing to the storage region of interest, using correction information of the storage region of interest for the data stored in the storage region of interest, the error detection and correction are carried out, and when the discorrectable error has been detected, the storage region of interest is judged to be the disusable region, while when no error has been detected or when the correctable error has been corrected, using detection information of the storage region of interest based on which it is detected whether or not the storage region of interest is faulty, it is detected whether or not the storage region of interest is faulty, and if it is judged that the storage region of interest is not faulty, then the storage region of interest is judged to be the usable region to execute the access processing, while if it is judged that the storage region of interest is faulty, then the storage region of interest is processed as the disusable region.

BRIEF DESCRIPTION OF DRAWINGS

FIG. 3 is a diagram useful in explaining block replacement;

BEST MODE FOR CARRYING OUT THE INVENTION

Preferred embodiments of the present invention will hereinafter be described with reference to the accompanying drawings.

Figure 1:
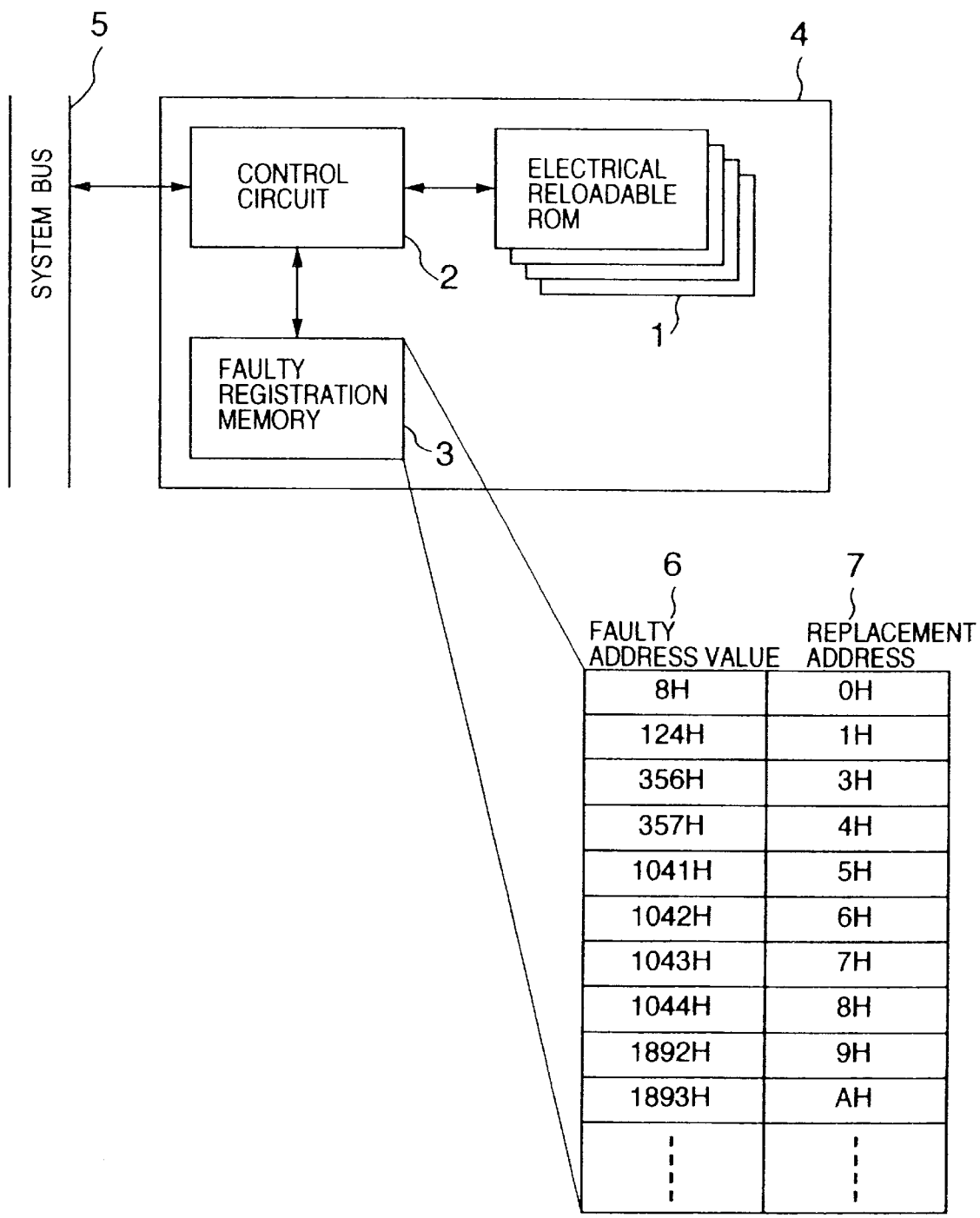
FIG. 1 is a diagram showing the overall configuration of a semiconductor memory device according to a first embodiment of the present invention.

FIG. 1 is a diagram showing the overall configuration of the present invention. In the figure, reference numeral 1 designates an electrically reloadable nonvolatile memory chip as a storage medium of a semiconductor memory device. In this connection, a flash memory is considered to be a memory which is most suitable for the electrically reloadable nonvolatile memory chip 1. With respect to this memory chip 1, it is assumed that the faulty regions are included therein in the ratio having a determined upper limit. In addition, it is assumed that the data which is stored in the memory chip 1 is divided into blocks each having a plurality of data as a unit in order to be administrated, and an administrative information region is provided every block.

As for the storage capacities of the block and the administrative information region, in the case of 32 Mbits (4 Mbytes) flash memory chip manufactured by HITACHI, LTD., for example, one block is 512 bytes and 16 bytes administrative information region is provided every block. Therefore, in one chip, 8,192 blocks are present and also the storage capacity of 128 Kbytes is provided for the administrative information region. Such a flash memory can be taken as one example of the most suitable memory for the memory chip 1. But, it should be noted that the total storage capacity, the number of bytes of one block, and the amount of data of the administrative information region are not limited to the above-mentioned values.

Reference numeral 2 designates a control circuit of the semiconductor memory device for coping with the access request issued from the outside, or carrying out an access to the memory chip 1 and carrying out the processings and the control within the device such as the administration of the faulty regions and the number of times of reloading. Reference numeral 3 designates a memory device for registering the faulty regions. In this connection, since the memory device 3 is reloadable and makes possible a high speed access, a DRAM or an SRAM is most suitable for the memory device 3. But, a ROM which is electrically reloadable in bytes can also be employed as the memory device 3 though it takes a lot of time for reloading and is relatively expensive. In the case of the ROM, its facility becomes as better as the data does not need to be loaded thereinto when turning on the power source.

Reference numeral 4 designates the semiconductor memory device of the present invention. Reference numeral 5 designates a system bus through which the access request is made to the present semiconductor memory device 4. In general, this system bus 5 is the peripheral bus of an information apparatus such as a personal computer. Reference numerals 6 and 7 show an example of the stored data in the fault registration memory 3, i.e., reference numeral 6 designates address values as the faulty regions, and reference numeral 7 designates replacement address values with which the address values of the faulty regions are to be replaced. As apparent from the figure, the adjacent address values correspond to each other. For example, it is shown that the region of the faulty region address 8H is replaced with the region of the replacement address 0H. Incidentally, it is assumed in the present example that the registrations of the faulty region addresses are arranged in ascending order.

The operation in the diagram of the present configuration will hereinbelow be described. The access request issued from the information apparatus connected to the system bus 5 is transmitted to the control circuit 2 through the system bus 5. Then, the control circuit 2 decodes the contents of the access request transmitted thereto to calculate the address of the data which has been transmitted thereto together with the access request. Then, the control circuit 2 recognizes the address value thus obtained as the administrative address.

Next, the control circuit 2 divides the regions, of the fault registration memory 3, to which the fault registration was made into halves to judge in which side of the halves the administrative address of interest is stored. For example, if the number of fault registrations is 1,024, then the control circuit 2 accesses first to the 512-th registered address. At this time, if that registered address is smaller than the administrative address of interest which is previously obtained, then there is the possibility that the administrative address of interest is stored in the region therebelow. On the other hand, if that registered address is larger than the administrative address of interest, then there is the possibility that the administrative address of interest is stored in the region thereabove. Next, the control circuit 2 further divides the regions on the side in which there is the possibility that the administrative address of interest is stored into halves to judge in which side the administrative address of interest may be registered.

Likewise, the control circuit 2 reads out either 256-th or 768-th registered address to compare the registered address thus read out with the administrative address of interest. In such a way, the amount of data to be compared is reduced half by half. Finally, it is judged whether or not the administrative address of interest is registered therein. If registered therein, then the corresponding replacement address value is obtained. Of course, in the case where when reducing the amount of registered data half by half, the control circuit 2 encounters the data equal to the administrative address of interest, the control circuit 2 stops the retrieval at that time point.

In general, in the case where 1,024 registered data for example is retrieved in order to obtain the administrative data of interest, when simply retrieving 1,024 registered data, the retrieval is required 1,024 times at maximum and also the retrieval is required 512 times in average. However, according to the present method, by carrying out the retrieval 9 times at maximum, it is possible to find out surely existence and non-existence of the administrative data of interest and the location thereof. If the administrative address value is not registered, since the data of this administrative address value does not correspond to any of the faulty regions, it can be accessed as the data of the normal block. If the fault registration is made for the administrative address value of interest, the region of the replacement address value is accessed so that the desired access can be carried out. Incidentally, if for the replacement region, the last region in the data storage regions is used, then the access thereto can be readily carried out.

Figure 2:
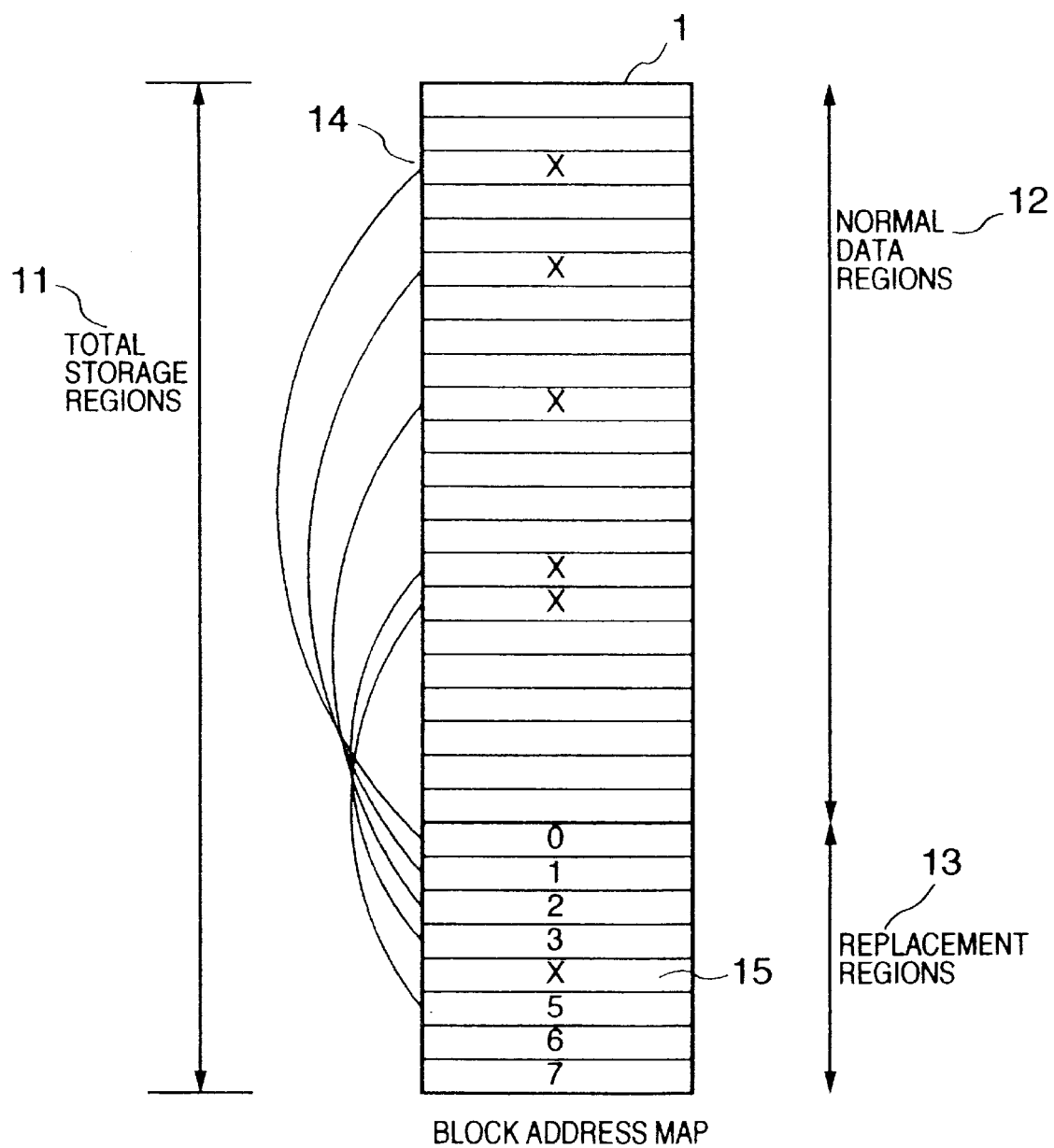
FIG. 2 is a diagram showing a memory map of a storage medium.

FIG. 2 shows the map of the storage regions which is used in this case. In the figure, reference numeral 11 designates total storage regions which include all of normal storage regions, faulty blocks and the replacement regions. Reference numeral 12 designates normal data regions consisting of normal blocks and faulty blocks. Reference numeral 13 designates replacement regions which occupy the lowest regions of the total storage regions. Reference numeral 14 designates the faulty block located within the normal data regions. Reference numeral 15 designates a faulty block located within the replacement regions. As apparent from the figure, it is shown that the faulty block located within the normal data regions is replaced with the block which is not the faulty block which is located within the replacement regions so as to correspond thereto.

Further giving the description with respect to the practical example, in the case where by employing 32 Mbits flash memory manufactured by HITACHI, LTD. which is previously taken as an example, 20-chips semiconductor memory device is constructed, the number of blocks is 163,840. Since the address value thereof is 18 bits, the fault address registration requires 18 bits every registration. On the other hand, assuming that the upper limit of the number of faulty regions is 5% of the overall regions, 8,192 faulty blocks will be present at maximum. This can be represented with 14 bits.

As a result, one fault registration requires the data of 32 bits in total of the faulty address values and the replacement address values, and hence the memory with 256 Kbits capacity is required for 8,192 blocks. Currently, however, the memory with capacity of this degree is very cheep. In this example, the total storage capacity of the normal data regions is 163,840−8,192=155,648 blocks. But, in the case where the fault registration memory is the nonvolatile memory, in order to store the faulty registered data in the nonvolatile memory, the additional 64 blocks are further used.

FIG. 3 is a diagram useful in explaining a method of using the administrative information regions within the nonvolatile memory 1. In the figure, reference numeral 21 designates the data storage contents of the nonvolatile memory as the storage medium of the semiconductor memory device of the present invention which contents are shown in the form of a diagram, reference numeral 22 designates a storage block of a physical address 1 (the number of the physical address is assumed to start with 1) of the nonvolatile memory, and reference numeral 23 designates a block of a physical address 2. In this connection, this block 23 is assumed to be the faulty block. Reference numeral 24 designates a block of a physical address 4 and reference numeral 25 designates a block of a physical address 7.

Reference numeral 30 designates data of an administrative address 1 which is stored in the block of the physical address 1, reference numeral 31 designates data of an administrative address 7 which is stored in the block of the physical address 4, and reference numeral 32 designates data of an administrative address 4 which is stored in the block of the physical address 7. That is, in the figure, the data of the administrative address 4 and the data of the administrative address 7 are replaced with each other. This reason is that since the data of the administrative address 7 is the data having the property such that the reloading is carried out frequently, the progress of degradation of the block of the physical address 7 needs to be suppressed. For this reason, the data of the physical address 7 is replaced with the data of the physical address 4.

Reference numerals 26, 27, 28 and 29 designate respectively the administrative information regions corresponding to the respective blocks of the physical addresses. In the administrative information regions 26, 27, 28 and 29, the administrative addresses of the data which are stored in the respective blocks are registered. The control circuit 2 of the present semiconductor memory device accesses, when requiring an access to the administrative address 1, to the administrative information region 26 of the physical address 1 and when the administrative address value registered therein is 1, accesses to the data of the corresponding block, thereby enabling the desired access to be carried out. It is understood that if the administrative address 4 is accessed in the state shown in this example, then the administrative information region 28 of the physical address 4 is accessed and on the basis of the administrative address value 7 registered therein, the physical address 7 is accessed so that the access to the desired administrative address 4 can be carried out.

Now, in the case where next to this state, it is judged that with respect to the block as well of the physical address 4, the progress of the degradation thereof should be suppressed due to the further frequent reloading which is made to the administrative address 7, first of all, the data of the administrative address 4 is transferred to the physical address 4 to be returned back to the original address, and next it is replaced with the data of the block which becomes an object of replacement. In the present example, the administrative address 1 is selected as that object of replacement. The state after completion of the replacement is shown in FIG. 3(b).

If this replacement work is not carried out, then the three-sided replacement will occur among the administrative addresses 1, 4 and 7. As a result, for example, if the administrative address 1 is intended to be accessed, first of all, the administrative information region 26 of the physical address 1 is accessed to obtain the administrative address 7, and next, the administrative information region 29 of the physical address 7 is accessed to obtain the administrative address value 4 so that the desired access can be carried out. If the replacement is further continued to occur, then the rotation of the access to the administrative information regions occurs in order to carry out the desired access and as a result, the access processing performance will be remarkably reduced.

Figure 4:
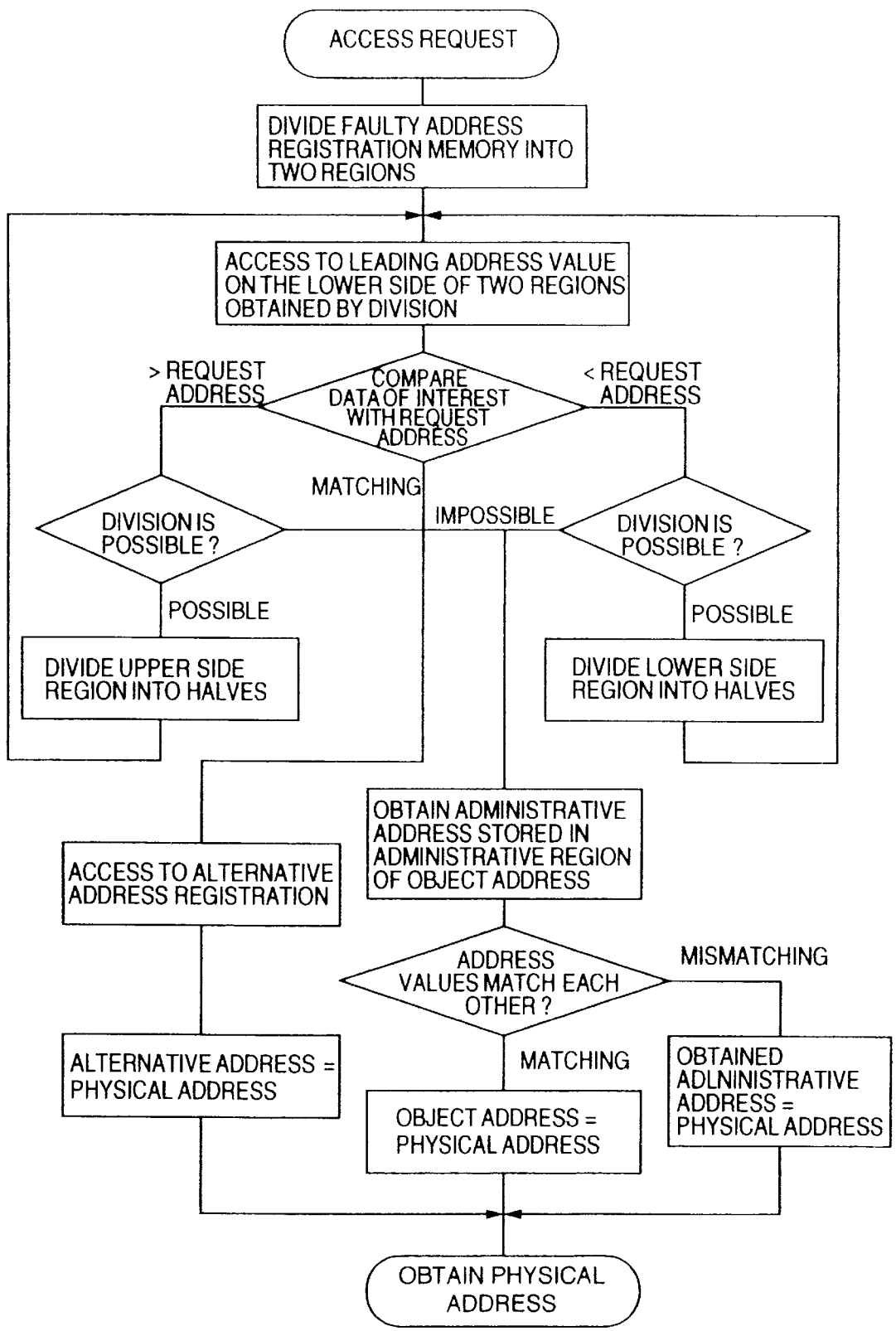
FIG. 4 is a flow chart showing the processing of retrieving an address in response to an access request.
Figure 5:
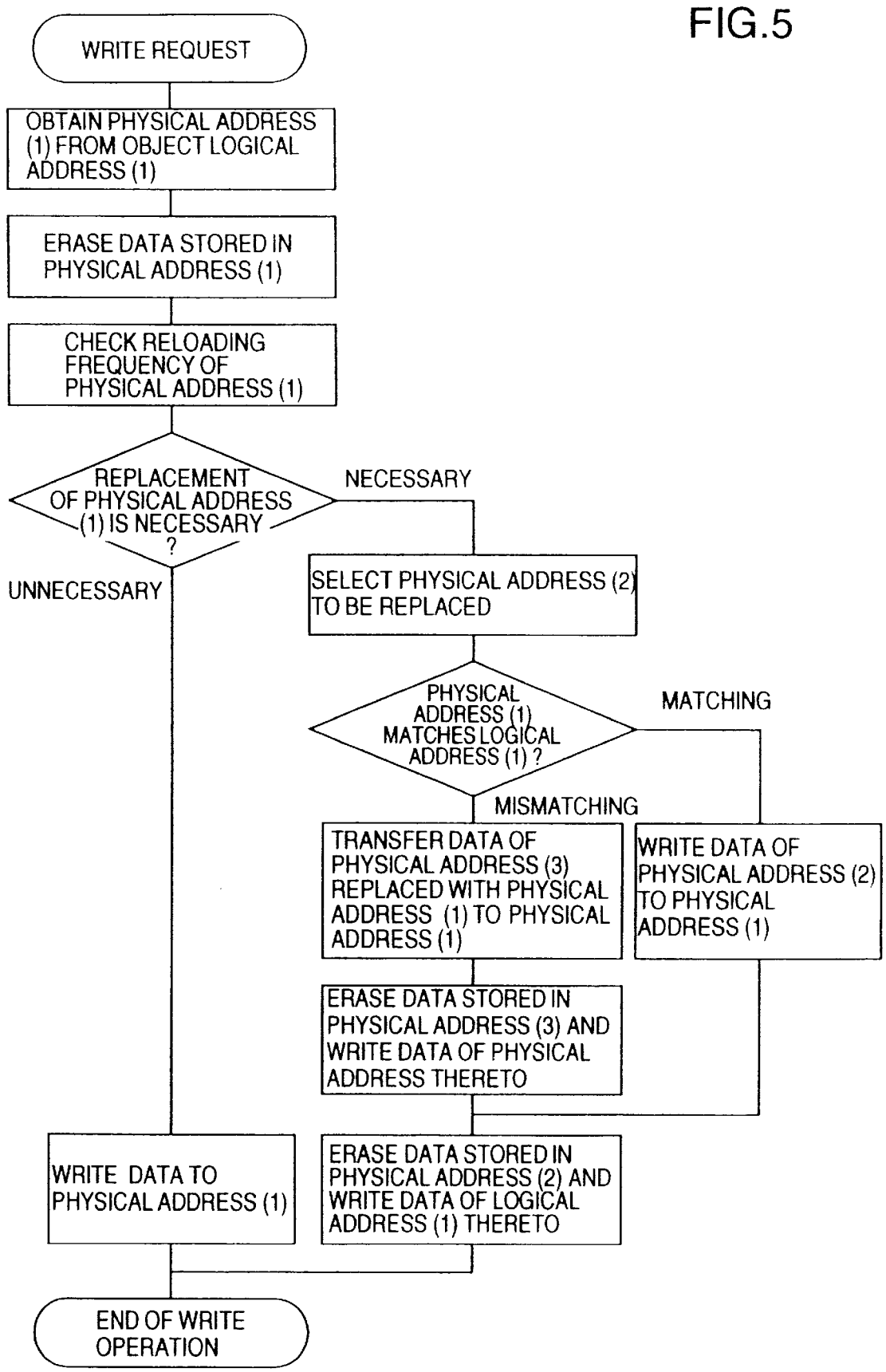
FIG. 5 is a flow chart showing the processing of replacing an address with another address.

FIGS. 4 and 5 show flow charts each useful in explaining the operation of the semiconductor memory device of the present invention. FIG. 4 is a flow chart useful in explaining the grasping of the physical address which is used to know where the data of the address corresponding to the access request is physically stored when issuing the access request. First of all, the capacity of the faulty address registration memory is divided into halves. For example, in the case of the memory with 64 Kbytes capacity, the capacity of this memory is divided into halves each having 32 bytes capacity.

Next, the leading address on the lower side is accessed. In the case of the memory with 64 Kbytes capacity, the address value at this time is 8000H. Then, the data which is obtained when accessing to the leading address on the memory (i.e., bits of the stored data, and the number thereof depends on the total number of fault registration addresses) is compared with the address corresponding to the access request. Then, if that data is larger than the request address, then there is the possibility that the request address may present on one side of the halves in which the smaller addresses are stored. On the other hand, if that data is smaller than the request address, then there is the possibility that the request address may present on the other side of the halves in which the larger addresses are stored.

This reason is because the address values located within the fault registration memory are arranged in either ascending order or descending order. In this connection, at this time, the two address values may match each other. In this case, since it becomes clear that the address value of interest is faultily registered, the alternative address thereof is read out and then it can be accessed as the physical address to be obtained. Next, the regions on the side in which the data of interest is estimated to be present are equally divided into halves. Then, likewise, the data of interest is compared with the address corresponding to the access request to estimate on which side the request address is present.

While after on which side of the halves the request address is present has been able to be estimated, the regions corresponding to the side of interest are further divided into halves, finally, the region can not be divided into halves any more. In the case where even when the division becomes impossible, the data of interest does not match the request address, the request address is judged to be the address which is not faultily registered. Then, the administrative region of the physical address of interest is accessed to obtain the administrative address. If the physical address matches the administrative address, then the region of interest corresponds to the region to which the access request was made. On the other hand, if matching is not obtained, then the region of the physical address which is equal to the obtained administrative address value corresponds to the region to which the access request was made.

The processing shown in this flow chart is executed in the write operation as well as in the read operation. In the read operation, the physical address which has been obtained through this processing, and the access processing is completed after sending the data. On the other hand, in the write operation, the processing shown in FIG. 5 is further required. First of all, the data which is stored in the obtained physical address (1) becomes unnecessary to be erased since the new data is already present.

At this time, it is checked whether or not there is necessity of the address replacement due to the frequent reloading of the physical address (1) of interest. As for an example of this method, the data relating to the number of times of reloading is recorded, and if the data has reached the fixed number of times, then it is judged that there is necessity of replacement. On the other hand, when it is judged that there is no need of the replacement, if the given data is directly written to the physical address (1), then the access will be completed.

On the other hand, if it is judged that there is need of carrying out the replacement, then the physical address (2) as an object of the replacement is selected. As for an example of a selection method, it is considered that the record of the number of times of reloading a little while ago is retrieved and then the region of the less number of times of reloading is selected. After completion of the selection, next, the administrative address value (1) of the physical address (1) which was an object of the writing is compared with the physical address (1). If the physical address value (1) matches the administrative address value (1), then it is judged that the sector of interest is not the sector in the state in which the replacement has been carried out. Therefore, if the data which is stored in the physical address (2) as an object of the replacement is directly written to the physical address (1) the data of which is already erased, and the data of the physical address (2) is erased and then the data of the administrative address (1) is written thereto, then the access operation is completed.

On the other hand, if the physical address value (1) does not match the administrative address value (1), then it is judged that the region of interest is the region in which the replacement is being carried out. Therefore, first of all, that replacement must be cancelled. Since the administrative address value (1) exhibits the physical address value (3) which is an object of the replacement, the data stored therein is transferred to the physical address (1) the data of which is already erased, thereby cancelling the replacement.

Next, the data of the physical address (3) is erased, and then the data of the physical address (2) which is a new object of the replacement is written thereto. Finally, the data of the physical address (2) is erased and then the data of the new administrative address (1) thus obtained is written to the physical address (2), thereby completing the write operation. The foregoing is the processing during the write operation.

The explanation of the operation of the embodiment of the semiconductor memory device according to the present invention has been completed. According to the present embodiment, there is provided the effect that it is possible to realize readily the semiconductor memory device which is interchangeable with any of the existing magnetic disc storage devices.

Next, another embodiment of the present invention will hereinafter be described with reference to FIGS. 6 to 10. In these figures, parts similar to those previously described are denoted by the same reference numerals.

Figure 6:
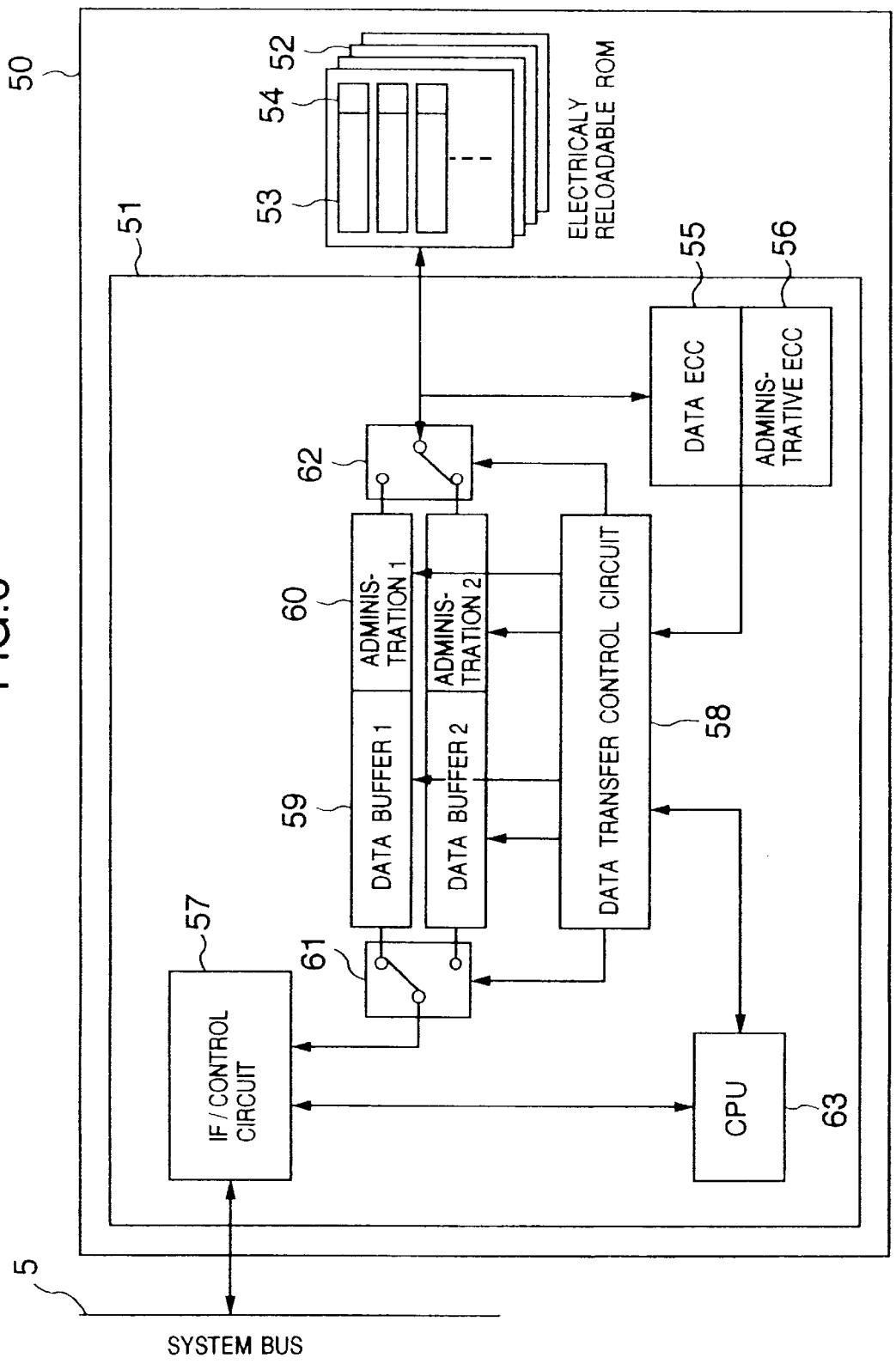
FIG. 6 is a diagram showing the overall configuration of a semiconductor memory device according to a second embodiment of the present invention.

FIG. 6 is a diagram showing a configuration of a flash memory card to which the present invention is applied. In FIG. 6, reference numeral 50 designates the above-mentioned flash memory card, reference numeral 51 designates a controller to which the present invention is applied, and reference numeral 52 designates an electrically reloadable nonvolatile memory as a storage medium (hereinafter, referred to as "a memory" for short, when applicable). The inside of the memory 52 is divided every region having a predetermined size (hereinafter, referred to as "a block" for short in the present embodiment), and each block consists of a storage data region 53 in which the storage data sent from the host is stored, and an administrative information region 54 in which the administrative information used to administrate the storage data region 53 is stored.

The storage data region 53 and the administrative information region 54 are in all referred to as a block. While in the present embodiment, the description is given with respect to the specific case where the memory which has the storage data regions 53 each having 512 bytes capacity and the administrative information regions 54 each having 16 bytes capacity is employed as the memory 52, it should be noted that the present invention is not limited thereto. Reference numeral 55 designates an ECC (Error Correcting Code) circuit for the storage data regions 53 (hereinafter, referred to as "a data ECC" for short, when applicable) for producing an error correcting code for a part of or all of the data within each of the storage data regions 53, and detecting and correcting errors, which are generated in transfer or storage, using the error correcting code thus produced, and reference numeral 56 designates, likewise, an ECC circuit for the administration information regions 54 (hereinafter, referred to as "an administrative ECC circuit" for short, when applicable). Incidentally, while the ECC may mean the code in which the correcting object data itself is contained therein in some cases, in the present embodiment, it is treated separately from the correcting object data.

Reference numeral 57 designates an I/F control circuit for transmitting/receiving, in response to the access from the host (not shown) such as a personal computer, the data to/from the host through the system bus 5. By the system bus 5 is meant the standard interface such as a PC Card Standard, or an AT Attachment Interface. Reference numeral 58 designates a data transfer control circuit for controlling the data transfer among the host, the memory 52, the data ECC circuit 55/administrative ECC circuit 56, and buffers as will be described later.

Reference numeral 59 designates a buffer for data for holding temporarily therein the data when transferring the stored data 53, and reference numeral 60 designates, likewise, a buffer for the administrative information region 54. In this connection, a set of buffers 59 and 60, A, and a set of buffers 59 and 60, B, are provided. Reference numeral 61 designates a host side buffer switching circuit for switching the two sets of buffers 59 and 60, reference numeral 62 designates, likewise, a memory side buffer switching circuit, and reference numeral 63 designates a CPU for controlling all of those elements.

Figure 7:
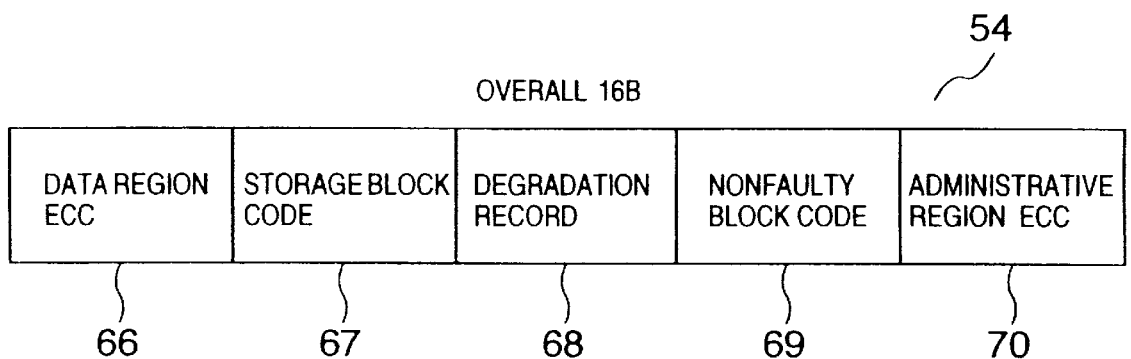
FIG. 7 is a diagram showing an example of data stored in an administrative information region.

FIG. 7 is a diagram showing an example of the contents of the administrative information region 54. In the figure, reference numeral 66 designates an error correcting code for the stored data (hereinafter, referred to as "an ECC for data" for short, when applicable), stored in the storage data region 53, which ECC for data is produced by the data ECC circuit 55, reference numeral 67 designates a storage block code which is used to record the kind of data stored in the storage data region 53 corresponding to the present administrative information region 54, e.g., identification codes each exhibiting the identification with respect to the constitutive information data, the data of the drive information, the data of the normal file, and the like, and to record the replacement addresses which are used to average the degradation, and reference numeral 68 designates a degradation record in which the degree of degradation of the block of interest is recorded in the form of a determined numeric value. For example, the number of times of erasing of the block of interest is suitable for the degradation record 68.

Reference numeral 69 designates an nonfaulty block code which is used to check predetermined codes, which are stored in the blocks, respectively, when reading out these codes, thereby identifying whether or not these codes are faulty, and reference numeral 70 designates an error correcting code for the administrative information regions 54 (hereinafter, referred to as "an ECC for administration" for short, when applicable). But, the ECC for administration 70 does not need to correspond to all of the data within the administrative information regions 54. For example, since the ECC for data 66 itself is an object of the error correction, it does not need to be made an object of the ECC for administration 70. In addition, the nonfaulty block code 69 is preferably excellent in the error detection capability and may not have the correction capability.

Next, the description will hereinbelow be given with respect to the outline of the operation of the flash memory card having a configuration shown in FIG. 6.

First of all, the host (not shown) transfers both of a write command and write data to the specified address through the system bus 5. In the present embodiment, it is assumed that the flash memory card 50 is interchangeable with the hard disc and hence it is also assumed that the write operation can be instructed on the basis of the cylinder, the head, the sector number and the like similarly to the hard disc. The data transfer control circuit 58 stores temporarily the write data in the data buffer 59. On reception of the write data, the CPU 63 analyzes both of the write command and the setting value which is previously set by the host to carry out the address calculation and finds out the corresponding block located within the memory 52 by the method as will be described later.

In this connection, in the case where the memory for which the erasing processing is required is employed as the memory 52 in the present embodiment, the erasing processing is executed.

Next, under the control by the CPU 63, the data transfer control circuit 58 writes the stored data within the data buffer 59 to the storage data region 53 of the above-mentioned corresponding block. In addition, the ECC for data 66 is produced by the data ECC circuit 55, and also the degradation record 68 and the like within the administrative information which has been read out from the administrative information region 54 when finding out the write block are changed in accordance with the new storage, so that the corresponding ECC for administration 70 is produced by the administrative ECC circuit 56. Then, the data transfer control circuit 58 stores the administrative information in the administrative information region 54 of the same block on the heels of the operation of writing the stored data. Both of the stored data and the administrative information are written collectively in the form of one block to the memory 52.

Incidentally, if the control is carried out in such a way that the stored data which has been sent from the host and the administrative information which has been read out from the memory 52 are stored in the different sets of buffers, respectively, using both of the host side buffer switching circuit 61 and the memory side buffer switching circuit 62, then the time period required for that processing can be shortened due to the parallel processing.

When the host requests the operation of reading out the stored data, similarly to the storage operation, the CPU 63 and the data transfer control circuit 58 find out the corresponding block from the memory 52 in accordance with the read command issued thereto, and read out the stored data from the memory 52 to store the stored data thus read out in the buffer 59. Next, the error detection of the data of the storage data region 53 is carried out using the ECC for data 66. If it is judged that there is no error, then the data is directly transferred to the host. On the other hand, if the error is detected, then the data containing the error thus detected is corrected to be transferred to the host. At the same time, the CPU 63 treats the block of interest as the faulty block to execute the alternative processing therefor. If the discorrectable error is detected, then the fact that such an error has been detected is reported to the host.

When a plurality of blocks are accessed, the two sets of data buffers A and B are alternately used to read out the data from the memory 52 and at the same time, to transfer the data to the host in parallel therewith.

If the erasing is required when the host requests the writing of the data, similarly to the foregoing, the corresponding block is found out and then the erasing of the data in the corresponding block is carried out. During this processing, if the replacement is necessary as a result of searching the degradation record 68, then the block as an object of replacement is selected using the well known method to read out the contents thereof, the storage block code 67 is rewritten, and the contents of the storage data region 53 and the contents of the administrative information region 54 are replaced with each other except for the degradation record 68. In the case where the erasing is carried out, on the basis of a predetermined method, the degradation record 68 is updated if necessary.

In addition, in the case where the speed of the transfer of the data from the memory 52 is higher than that of the transfer of the data to the host, for a time period left over, with respect to the block to which the next access will be made, the nonfault check and the retrieval of the alternative address as will be described later can be made using the two data buffers, which contributes to the promotion of high speed performance.

Next, a method of retrieving the block in response to the access request issued from the host, as the feature of the present invention, will hereinbelow be described in more detail with reference to FIGS. 8 and 9.

Figure 8:
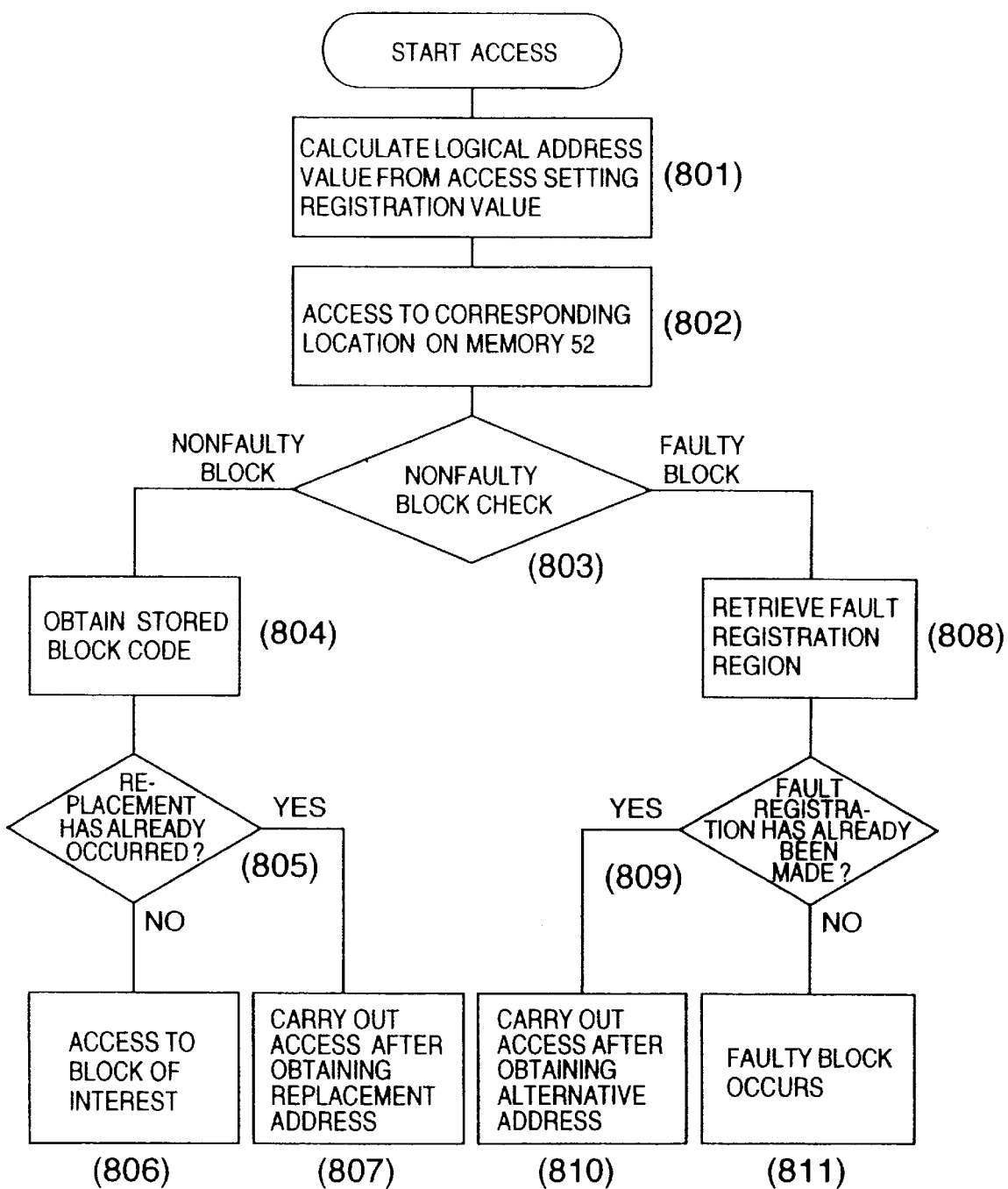
FIG. 8 is a flow chart showing the processing of determining an access location.

FIG. 8 is a flow chart useful in explaining the processing to the extent of computing, by the CPU, the physical address value on the memory 52 in response to the access command issued thereto when the access request has been issued from the host.

Normally, when intending to carry out the access, the host carries out the access without being conscious of the data storage location on the memory. In the present embodiment, it is assumed that the memory card may be replaced with the hard disc, and hence as described above, the host issues the access command similar to that in the hard disc.

The CPU 63 receives the above-mentioned command issued from the I/F control circuit 57 and calculates the logical address value corresponding to the arrangement of the data storage on the memory (Step 801). Next, the CPU 63 accesses the corresponding address of the memory 52 on the basis of the logical address value thus calculated (Step 802), and then reads out the administrative information stored in the administrative information region 54. Incidentally, it is assumed that in the inside of the memory 52, all of the contents of one block are read out to the buffer in the memory 52 in accordance with the address, and only either the administrative information or the stored data is sent from that buffer to the controller 51. Then, it is judged on the basis of the administrative information thus sent whether or not the block of interest is a usable nonfaulty block (Step 803). This judgement method will be described later with reference to FIG. 9.

Next, the processing of interest branches off in the following processings depending on the judgement result. First of all, if it is judged that the block of interest is the nonfaulty block (the block of interest may be corrected on the basis of the ECC), then the CPU 63 obtains the storage block code 67 within the administrative information region 54 which has been read out to be written to the buffer 60 (Step 804). Then, the replacement address value stored in the storage block code 67 is compared with the logical address value based on which the present block has been come to be accessed (Step 805). If matching is obtained, then the block of interest is the block in which the replacement does not occur, and hence the block of interest is directly judged to be the access block to be accessed (Step 806). During the read access, the stored data is read out from the buffer within the above-mentioned memory 52. During the write access, the administrative information corresponding to the stored data which is already set in the buffer 59 to be written thereto.

On the other hand, if the mismatching is obtained, then the replacement has occurred and hence it can be judged that the block corresponding to the replacement address value within the storage block code 67 is the access block. Therefore, the block of the physical address value which the storage block code 67 exhibits is newly accessed (Step 807). When accessing to the block to which the replacement has been made, the nonfaulty block check may further be carried out.

On the other hand, if it is judged that the block of interest is the faulty block, then the fault registration region as will be described later is newly accessed (Step 808). If the block of interest is already registered in the fault registration region (Step 809), then the registrated value, i.e., the alternative address is obtained, and the block of the corresponding physical address value is accessed (Step 810).

On the other hand, if the fault registration is not yet made to the fault registration region, then it is judged that the block of interest is the faulty block which has newly occurred (Step 811), and hence the access to the block of interest is impossible. In the case of the read access, the CPU 63 informs the host of the access error. In the case of the write access, since the data is already rewritten, there is no need of informing the host of the error occurrence, and hence the alternative block is assigned thereto and the data is stored in the alternative block. At the same time, the CPU 63 writes the alternative block address to the region corresponding to the faulty block located within the fault registration region 84.

In the case where the above-mentioned faulty block information is not held in the external memory but is held in the inside, if the faulty block information is formerly searched, then the following problems arise. That is, since the access time of the nonvolatile memory is long, it takes time to carry out the search. In addition, since the access of the flash memory is carried out in blocks, in order to obtain the individual fault registration information, the fault registration information will be collectively read out and also the sequential access will be made to the fault registration information. For this reason, it takes time to access to somewhat the last of the information in the fault registration region.

The above-mentioned method was provided in order to solve the foregoing problems. According to the above-mentioned method, first of all, the fault registration region is not searched, but the corresponding block is accessed using the logical address. Then, the present invention may provide the method wherein the fault registration is not accessed till it is judged that the block associated with the information obtained from the administrative information region is faulty. Therefore, the number of times of access to the memory till the data stored in the nonfaulty block is obtained is reduced and hence the access time viewed from the host is shortened.

In addition, the present invention may provide the method wherein in the case where the block of interest is not faulty, but for the purpose of averaging the number of times of reloading, the block is replaced with another block, the access is carried out in accordance with the address information within the storage block code 67.

In addition, the present invention may provide the method wherein in the case where the block of interest in the memory 52 is faulty, since there is no reliability in the information as well within the above-mentioned administrative information region 54, the alternative block information is not stored in the storage block code 67 or something like that, but is stored in the fault registration region which is separately provided. While in the access to the fault registration region, the sequential access as described above exerts an influence thereon, since the fault occurrence rate is low, there is no problem.

Next, the fault registration method as described above will hereinbelow be described in more detail.

Figure 9:
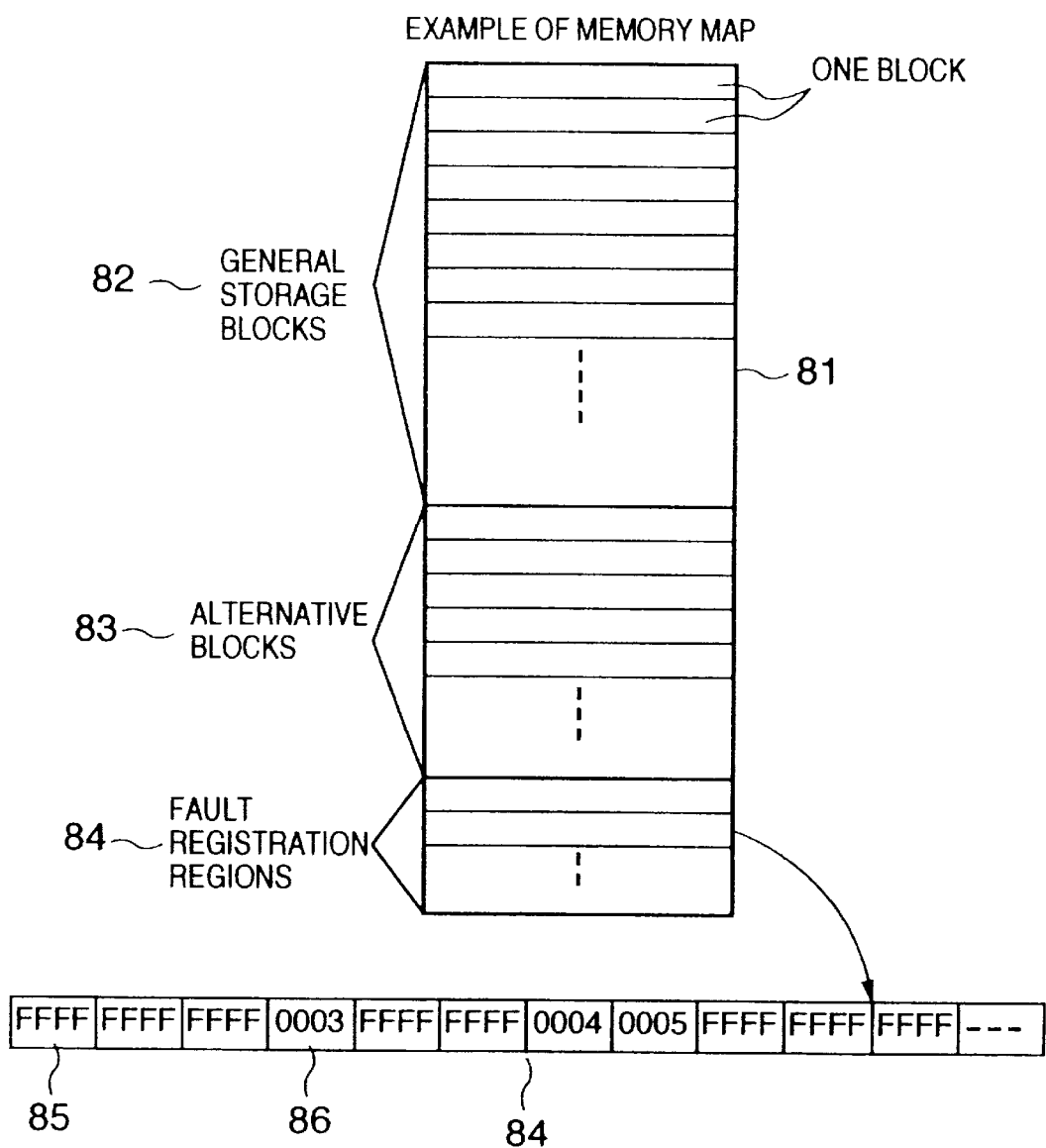
FIG. 9 is a diagram showing a memory address map containing therein a faulty registration region.

FIG. 9 shows an example of a memory map in the inside of the memory 52, and the contents which are registered in the storage data region 53 of one block in the fault registration region. In the figure, reference numeral 81 designates a memory map of the overall storage region or a part thereof, i.e., one chip or the like of the memory, reference numeral 82 designates a general storage block group in which the data is stored in correspondence to the logical address values in the memory map 81, reference numeral 83 designates an alternative block group in which the faulty block which is present or occurs in the general storage block is replaced to store the data, and reference numeral 84 designates a fault registration region in which the alternative address when having carried out the replacement is registered. In the fault registration region 84, the alternative address is registered in a part of the storage data region 53.

In the fault registration region 84, the registration region for all of the blocks of the general storage block group 82 is ensured. In addition, the blocks of the general storage block group 82 are made correspond to the registration regions in the fault registration region 84. While it is assumed in the present embodiment that the data is assigned to the fault registration region in the order of the addresses of the general storage block, it should be noted that the present invention is not limited thereto.

In the present embodiment, as shown in FIG. 9, for the fault registration, 2 bytes are assigned to every block. In this connection, reference numeral 85 shows the case where the block of interest (its address is 0000) of the general storage block 82 is not faulty, and as one example, FFFF are registered therein. While the value exhibiting that the block of interest is not faulty may be the value which may not be the alternative block address, in order to make simple the judgement whether or not the fault registration is made in Step 809 of FIG. 8 as described above, it is preferable that all of the bits are made either 1s or 0s. Reference numeral 86 shows that the block of the general storage block address 0003 is faultily registered, and it is replaced with the block of the alternative block address 0003. In addition, it is shown in 86 that the general storage block addresses 0006 and 0007 are replaced with the alternative block addresses 0004 and 0005, respectively.

Since the address assignment in the inside of the alternative block group 83 sufficiently cover the alternative addresses, the registration thereof is possible with the less number of bytes. Whether or not the fault registration is made can be judged depending on the judgement whether the registered value is FFFF or the address value other than FFFF is registered as the registered value. Incidentally, it is desirable that the ECC is produced in the fault registration region 84 as well in order to improve the reliability. In this case, in the same procedure as that of the general storage block, the ECC circuit may be applied thereto.

Next, the description will hereinbelow be given with respect to the processing of judging whether or not the accessed block is faulty.

Figure 10:
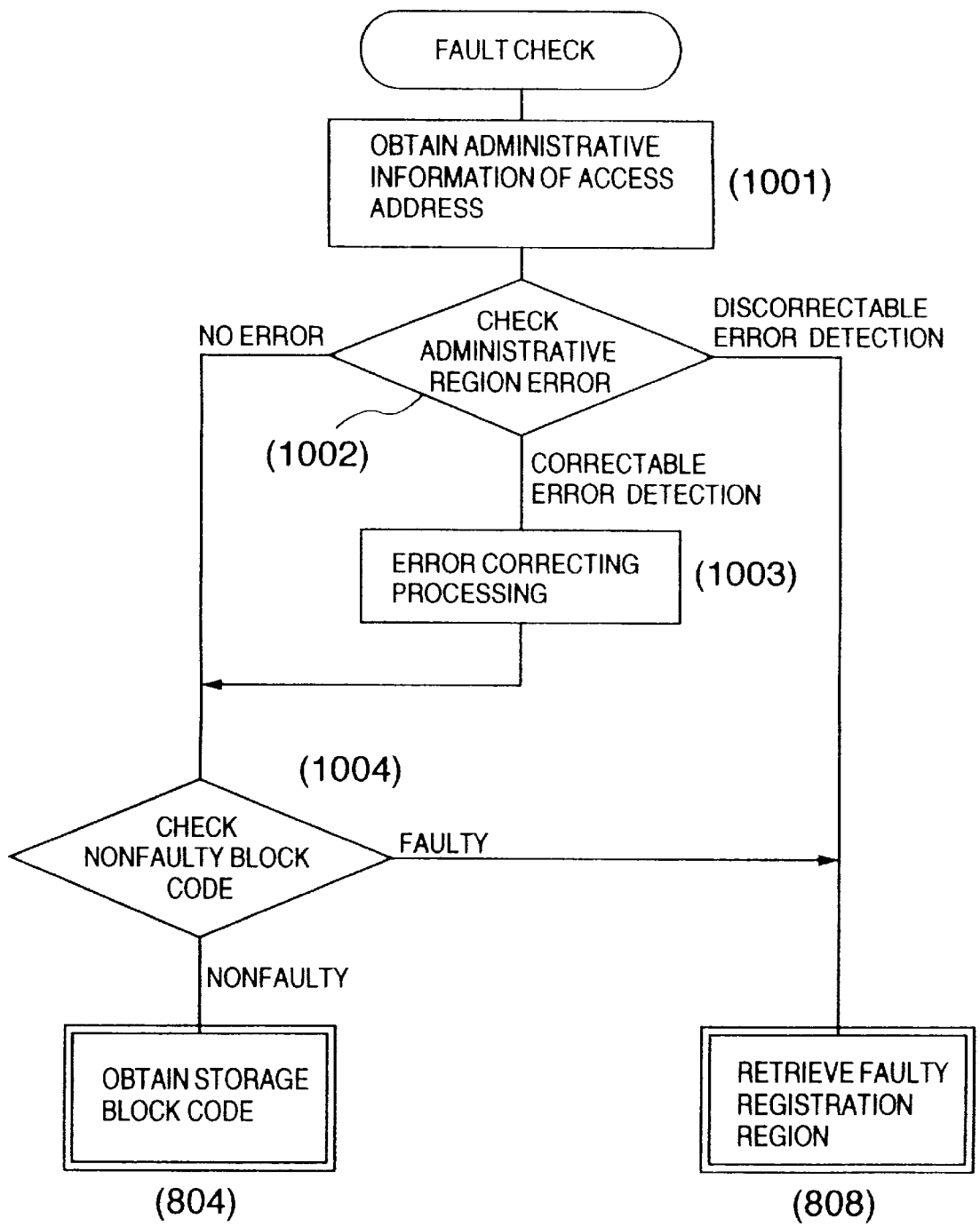
FIG. 10 is a flow chart showing the processing of judging whether or not an accessed block is faulty.

FIG. 10 is a flow chart useful in explaining the judgement whether or not the block of interest is faulty, and more particularly useful in explaining in more detail the nonfaulty block check (Step 803) in the overall flow chart shown in FIG. 8.

First of all, the CPU 63 accesses to the block of interest on the basis of the obtained logical address to read out the administrative information within the administrative information region 54 (Step 1001). Then, using the ECC for administration 70 of the administrative information thus read out, the CPU 63 detects the error of the obtained administrative information (Step 1002). Then, the processing branches into the three states, i.e., no error, detection of a correctable error and detection of a discorrectable error. In the case of the detection of the discorrectable error, the block of interest is judged to be the faulty block, and then the processing proceeds to the processing of retrieving the fault registration region 84 (Step 808). On the other hand, in the case of the detection of the correctable error, the processing of the correcting the error is executed (Step 1003). In the case of no error or completion of the execution of the correction, the nonfaulty block code 69 which has been read out is checked (Step 1004).

As described above with reference to FIG. 7 as well, nonfaulty block code 69 is used to confirm matching or mismatching on the basis of the specific code which is previously stored and which is common to all of the blocks. If though no error is detected through the check by the ECC for administration 70, matching is not obtained for the nonfaulty block code 69, then it is judged that the false detection has occurred. In other words, this is the phenomenon which is caused when the code of interest due to the occurrence of the error accidentally matches the code with no error.

In addition, in the case where though likewise, the error correction processing is executed, the mismatching is obtained for the nonfaulty block code 69, it is judged that the code of interest due to the occurrence of the error accidentally matches the correctable code so that the false correction is made, and on the basis of this judgement, the block of interest is regarded as the faulty block. Then, the processing proceeds to the processing of retrieving the fault registration region 84. In the case other than the above-mentioned cases, the block of interest is judged to be the block with no error or the nonfaulty block for which the correction is already made.

Incidentally, the case is also naturally conceivable where after completion of the false detection or the false correction, matching is accidentally obtained for the nonfaulty block code. However, the probability of occurrence of the false detection or the false correction itself is very low, and in addition thereto, it can be judged that the probability in which matching is accidentally obtained for the nonfaulty block code may not be actually caused. In addition, such judgement can be carried out employing the ECC method wherein the false detection rate or the false correction rate is not large, and also by increasing the number of bits of the nonfaulty block code.

As set forth hereinabove, according to the present embodiments, there are provided the following effects:

1. Since the information of the faulty blocks is registered in the fault registration regions 84 located within the memory 52, no external registration memory is required.

2. Since the administrative information of the block corresponding to the logical address is looked at in advance to judge whether or not the block of interest is faulty, the number of times of access to the memory 52 from the controller is effectively reduced as compared with the method of searching the fault registration information in advance, and therefore, the access time, up to a time point when obtaining the objective data, viewed from the host side can be shortened.

Accordingly, the improvements in the processing speed and the reliability are possible in the judgement whether or not the block of interest is faulty, and the promotion of the high speed, the high performance and the high reliability of the memory device itself can be realized. In addition, since no external memory is used, the promotion of the low cost can also be realized.

Incidentally, by integrating the controller 51 and the memory 52 of the above-mentioned embodiments into one chip, there is obtained the effect that the buffer in the memory 52, and the buffers 59 and 60 in the controller 51 can be collectively arranged so that the scale of the circuitry can be reduced. In addition, since the signal lines distributed between the controller 51 and the memory 52 becomes unnecessary, there is provided the effect that the package having the less number of terminals can be employed.

INDUSTRIAL APPLICABILITY

According to the present invention, in a semiconductor memory device having partially faulty cells, the capacity of a memory can be reduced or deleted which is used in conversion address registration resulting from the replacement or substitution of addresses, and further the retrieval of fault can be carried out at a higher speed. Accordingly, both of the promotion of high speed of access and the promotion of lowering the cost thereof become possible.

In addition, even in the case where a nonvolatile memory is used in which there is a limitation in the number of times of reloading, and also an address is replaced with another address, the address retrieval can be made at a higher speed and hence it is possible to improve the access performance.

We claim:

1. A storage device comprising:
   a system interface unit which carries out interface with a host system via an external bus;
   a controller coupled with said system interface unit which analyzes commands received by said system interface unit from said host system and controls operations to be performed within said storage device;
   a non-volatile semiconductor memory coupled with said controller;
   an error correction unit, coupled with said non-volatile semiconductor memory, which performs an error detection and error correction operation for data stored in said non-volatile semiconductor memory; and
   two memories coupled between said system interface unit and said non-volatile semiconductor memory,
   wherein said non-volatile semiconductor memory is electrically erasable and electrically programmable and stores data from said host system via said system interface unit, and
   wherein, in response to a read command received by said system interface unit, said controller carries out a read operation of data to said two memories from said non-volatile semiconductor memory to carry out concurrent operations of data transferring of data which has been subjected to the error detection and error correction operation by said error correction unit from one of said two memories to said host system via said system interface unit and of data transferring of subsequent data which is to be subjected to the error detection and error correction operation from said non-volatile semiconductor memory to another of said two memories.

2. A storage device according to claim 1,
   wherein said non-volatile semiconductor memory includes a plurality of memory blocks each of which has a predetermined memory size,
   wherein each of said plurality of memory blocks includes a storage data area for storing storage data sent from said host system and an administrative information area for storing administrative information usable to administrate said storage data area, and
   wherein said administrative information area of each of said plurality of memory blocks includes an error correction code of said storage data area and an error correction code for said administrative information area.

3. A storage device according to claim 1,
   wherein said two memories are buffer memories which store said data read out from said non-volatile semiconductor memory.

4. A storage device comprising:
   a system interface unit which carries out interface with a host system via an external bus;
   a controller coupled with said system interface unit which analyzes commands received by said system interface unit from said host system and controls operations to be performed within said storage device;
   a non-volatile semiconductor memory coupled with said controller;
   a non-volatile semiconductor memory coupled with said controller;
   an error correction unit, coupled with said non-volatile semiconductor memory, which performs an error detection and an error correction operation for data stored in said non-volatile semiconductor memory; and
   two memories coupled between said system interface unit and said non-volatile semiconductor memory,
   wherein said non-volatile semiconductor memory is electrically erasable and electrically programmable and stores data from said host system via said system interface unit, and
   wherein, in response to a read command received by said system interface unit, said controller carries out a read operation of data to said two memories from said non-volatile semiconductor memory to carry out parallel operations of data transferring of data which has been subjected to the error detection and error correction operation by said error correction unit from one of said two memories to said host system via said system interface unit and of data transferring of subsequent data which is to be subjected to the error detection and error correction operation from said non-volatile semiconductor memory to another of said two memories.

5. A storage device according to claim 4,
   wherein said non-volatile semiconductor memory includes a plurality of memory blocks, each of which has a predetermined memory size,
   wherein each of said plurality of memory blocks includes a storage data area for storing storage data sent from said host system and an administrative information area for storing administrative information usable to administrate said storage data area, and
   wherein said administrative information area of each of said plurality of memory blocks includes an error correction code of said storage data area and an error correction code for said administrative information area.

6. A storage device according to claim 4,
   wherein said two memories are buffer memories which store said data read out from said non-volatile semiconductor memory.

7. A storage device comprising:
   a system interface unit which carries out interface with a host system via an external bus;
   a controller coupled with said system interface unit which analyzes commands received by said system interface unit from said host system and controls operations to be performed within said storage device;
   a non-volatile semiconductor memory coupled with said controller;
   an error correction unit, coupled with said non-volatile semiconductor memory, which performs an error detection and error correction operation for data stored in said non-volatile semiconductor memory; and
   two memories coupled between said system interface unit and said non-volatile semiconductor memory,
   wherein said non-volatile semiconductor memory is electrically erasable and electrically programmable and stores data from said host system via said system interface unit, and wherein, in response to a read command received by said system interface unit, said controller carries out a read operation of data to said two memories from said non-volatile semiconductor memory to carry out overlap operations of data transferring of data which has been subjected to the error detection and error correction operation by said error correction unit from one of said two memories to said host system via said system interface unit and of data transferring of subsequent data which is to be subjected to the error detection and error correction operation from said non-volatile semiconductor memory to another of said two memories.

8. A storage device according to claim 7, wherein said non-volatile semiconductor memory includes a plurality of memory blocks each of which has a predetermined memory size, wherein each of said plurality of memory blocks includes a storage data area for storing storage data sent from said host system and an administrative information area for storing administrative information usable to administrate said storage data area, and wherein said administrative information area of each of said plurality of memory blocks each includes an error correction code of said storage data area and an error correction code for said administrative information area.

9. A storage device according to claim 7, wherein said two memories are buffer memories which store said data readout from said non-volatile semiconductor memory.

* * * * *